United States Patent
Sakaguchi

(10) Patent No.: US 9,680,125 B2
(45) Date of Patent: Jun. 13, 2017

(54) ORGANIC ELECTROLUMINESCENT LIGHTING DEVICE AND METHOD FOR MANUFACTURING THE SAME

(75) Inventor: Yoshikazu Sakaguchi, Tokyo (JP)

(73) Assignee: NEC LIGHTING, LTD., Tokyo (JP)

( * ) Notice: Subject to any disclaimer, the term of this patent is extended or adjusted under 35 U.S.C. 154(b) by 93 days.

(21) Appl. No.: 13/634,160

(22) PCT Filed: Apr. 26, 2011

(86) PCT No.: PCT/JP2011/060131
§ 371 (c)(1),
(2), (4) Date: Sep. 11, 2012

(87) PCT Pub. No.: WO2011/136205
PCT Pub. Date: Nov. 3, 2011

(65) Prior Publication Data
US 2013/0002126 A1   Jan. 3, 2013

(30) Foreign Application Priority Data
Apr. 28, 2010 (JP) ................................. 2010-103166

(51) Int. Cl.
*H01J 1/62* (2006.01)
*H01L 51/52* (2006.01)

(52) U.S. Cl.
CPC ...... *H01L 51/5228* (2013.01); *H01L 51/5203* (2013.01); *H01L 2251/5361* (2013.01); *H01L 2251/5392* (2013.01)

(58) Field of Classification Search
CPC .......... H01L 27/3281–27/329; H01L 27/3297; H01L 51/5228; H01L 51/5203; H01L 2251/5392; H01L 2251/5361
(Continued)

(56) References Cited

U.S. PATENT DOCUMENTS 6,111,357 A * 8/2000 Fleming et al. .............. 313/509

FOREIGN PATENT DOCUMENTS

EP   0971564 A2   1/2000
EP   1914816 A2   4/2008
(Continued)

OTHER PUBLICATIONS

The international search report for PCT/JP2011/060131 mailed on May 31, 2011.
(Continued)

*Primary Examiner* — Vip Patel

(57) ABSTRACT

The present invention is to provide an organic electroluminescent lighting device that can reduce the occurrence of short-circuiting caused by inrush current. The organic electroluminescent lighting device includes: transparent substrate 1; positive electrode film 2 that is formed on the surface of transparent substrate 1 and includes terminal 2a formed at one end or both ends and electrode 2b formed continuously from terminal 2a; negative electrode terminal film 3 that is formed separate from positive electrode film 2 on the surface of transparent substrate 1 and includes first resistive region 7; organic light emitting film 4 formed on the surface of electrode 2b of positive electrode film 2; and negative electrode film 5 continuously formed from the surface of organic light emitting film 4 to the surface of negative electrode terminal film 3. When viewed from a first cut surface that is along a thickness direction of negative electrode terminal film 3, a conductor's cross-sectional area in first resistive region 7 is smaller than a negative electrode terminal film's cross-sectional area at boundary 11a with outer peripheral part of negative electrode film 5.

8 Claims, 4 Drawing Sheets

(58) Field of Classification Search
USPC .............................. 313/498, 506, 512; 445/46
See application file for complete search history.

(56) References Cited

FOREIGN PATENT DOCUMENTS

| | | |
|---|---|---|
| JP | S62170188 A | 7/1987 |
| JP | H02-054894 A | 2/1990 |
| JP | H02126589 A | 5/1990 |
| JP | 2001-085158 A | 3/2001 |
| JP | 2001155856 A | 6/2001 |
| JP | 2002-359085 A | 12/2002 |
| JP | 2004296154 A | 10/2004 |
| JP | 2006253302 A * | 9/2006 |
| JP | 2006286393 A | 10/2006 |
| JP | 2007-227094 A | 9/2007 |

OTHER PUBLICATIONS

Japanese Office Action for JP Application No. 2012-512848 mailed on Dec. 9, 2014 with English Translation.
Extended European Search Report for EP Application No. EP11774986.1 dated on Oct. 17, 2016.
Japanese Office Action for JP Application No. 2012-512848 mailed on Mar. 1, 2016 with English Translation.

* cited by examiner

ORGANIC ELECTROLUMINESCENT LIGHTING DEVICE AND METHOD FOR MANUFACTURING THE SAME

TECHNICAL FIELD

The present invention relates to an organic electroluminescent lighting device including an organic light emitting film, and a method for manufacturing the same.

BACKGROUND ART

The organic electroluminescent lighting device is generally formed into a structure where the organic light emitting film is held between a flat-plate positive electrode film and a flat-plate negative electrode film and then mounted on a transparent substrate such as a glass substrate. Accordingly, the organic electroluminescent lighting device serves both as a light emitting diode and a capacitor. This may cause a problem, namely, short-circuiting due to inrush current, when energization is started in a long unused state (state where no charge has been stored). Further, when static electricity generates a high electric field between the positive electrode film and the negative electrode film, a problem, namely, insulation breakdown, may occur. Display devices have been offered to solve the problems. Patent Literature 1 (JP2006-286393A) discloses one of such display devices.

The display device disclosed in Patent Literature 1 includes a positive electrode extraction wiring laid to electrically connect a power source installed outside the device to the positive electrode. This positive electrode extraction wiring includes a resistive region where its line width is smaller than those of other regions. The resistive region can limit inrush current, and thus it is difficult for a short-circuiting to occur. A voltage drop in the resistive region, and thus a high electric field is difficult to be applied between the positive electrode and the negative electrode. As a result, it is difficult for insulation breakdown to occur due to static electricity.

CITATION LIST

Patent Literature 1: JP2006-286393A

SUMMARY OF INVENTION

Problems to be Solved by Invention

In the organic electroluminescent lighting device having a capacitor structure, in many cases, analysis of a place where the inrush current has caused the short-circuiting finds peering-off of the negative electrode film from the organic light emitting film. This may be attributed to easier flowing of current through the negative electrode film than through the positive electrode film because the electric resistance value is smaller, and the negative electrode film is damaged more easily by the inrush current (large current) than the positive electrode film. However, in the device described in the Patent Literature 1, only the positive electrode side includes the resistive region. Thus, in this device, countermeasures to prevent short-circuiting caused by inrush current may be insufficient. The phenomenon is aggravated by lower adhesion between the organic light emitting film and the negative electrode film than that between the positive electrode and the organic light emitting film, and by non-uniform entry of the material of the negative electrode film into the organic light emitting film near the surface of the organic light emitting film when a negative electrode material is physically deposited (vacuum deposition) on the amorphous and microscopically porous organic light emitting film.

It is therefore an object of the present invention to provide an organic electroluminescent lighting device that can reduce the occurrence of short-circuiting caused by inrush current, and a method for manufacturing the same.

Solution to Problem

To achieve the object, an organic electroluminescent lighting device according to the present invention includes: a transparent substrate; a positive electrode film that is formed on the surface of the transparent substrate and includes a terminal formed at one end or both ends and an electrode formed continuously from the terminal; a negative electrode terminal film that is formed separate from the positive electrode film on the surface of the transparent substrate and includes a first resistive region; an organic light emitting film formed on the surface of the electrode of the positive electrode film; and a negative electrode film continuously formed from the surface of the organic light emitting film to the surface of the negative electrode terminal film. When viewed from a first cut surface that is parallel to a boundary between the negative electrode terminal film and an outer peripheral part of the negative electrode film and that is along a thickness direction of the negative electrode terminal film, a conductor's cross-sectional area in the first resistive region is smaller than a negative electrode terminal film's cross-sectional area at the boundary.

To achieve the object, another organic electroluminescent lighting device according to the present invention includes: a transparent substrate; a positive electrode film that is formed on the surface of the transparent substrate and includes a terminal formed at one end or both ends and an electrode formed continuously from the terminal; a negative electrode terminal film formed separate from the positive electrode film on the surface of the transparent substrate; an organic light emitting film formed on the surface of the electrode of the positive electrode film; and a negative electrode film continuously formed from the surface of the organic light emitting film to the surface of the negative electrode terminal film. The resistance of the material of the negative electrode terminal film is higher than that of the material of the negative electrode film.

To achieve the object, a method for manufacturing an organic electroluminescent lighting device according to the present invention includes: the first film formation step of forming a positive electrode film on the surface of a transparent substrate, which includes a terminal formed at one end or both ends and an electrode formed continuously from the terminal, and a negative electrode terminal film separate from the positive electrode film, which includes a first resistive region; the second film formation step of forming an organic light emitting film on the surface of the electrode of the positive electrode film; and the third film formation step of forming a negative electrode film continuously from the surface of the organic light emitting film to the surface of the negative electrode terminal film. In the first film formation step, when viewed from a first cut surface that is parallel to a boundary between the negative electrode terminal film and an outer peripheral part of the negative electrode film and that is along a thickness direction of the negative electrode terminal film, the negative electrode terminal film is formed so that a conductor's cross-sectional area in the first resistive region is smaller than a negative electrode terminal film's cross-sectional area at the boundary.

To achieve the object, a method for manufacturing another organic electroluminescent lighting device according to the present invention includes: the first film formation step of forming a positive electrode film on the surface of a transparent substrate, which includes a terminal formed at one end or both ends and an electrode formed continuously from the terminal, and a negative electrode terminal film separate from the positive electrode film; the second film formation step of forming an organic light emitting film on the surface of the electrode of the positive electrode film; and the third film formation step of forming a negative electrode film continuously from the surface of the organic light emitting film to the surface of the negative electrode terminal film. In the first film formation step, the negative electrode terminal film is formed by using a material higher in resistance than that of the negative electrode film.

Effects of Invention

According to the present invention, the negative electrode terminal film is added as a resistive component on the negative electrode side, and large current is difficult to flow through the negative electrode film. Thus, since the negative electrode film is difficult to be damaged even when inrush current flows, the occurrence of short-circuiting caused by the inrush current can be reduced.

DESCRIPTION OF EMBODIMENTS

Figure 1:
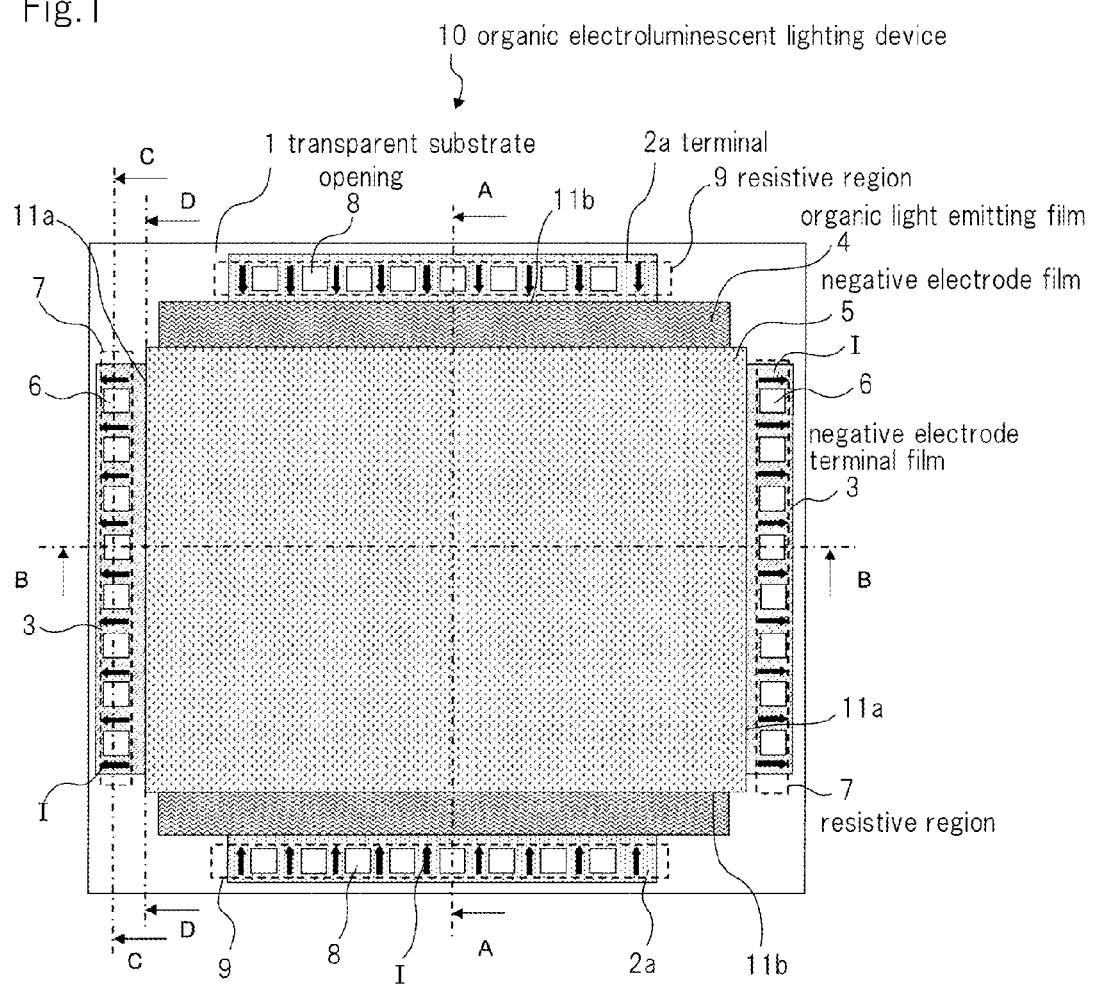
FIG. 1 A plan view showing an organic electroluminescent lighting device according to an embodiment of the present invention.
Figure 2:
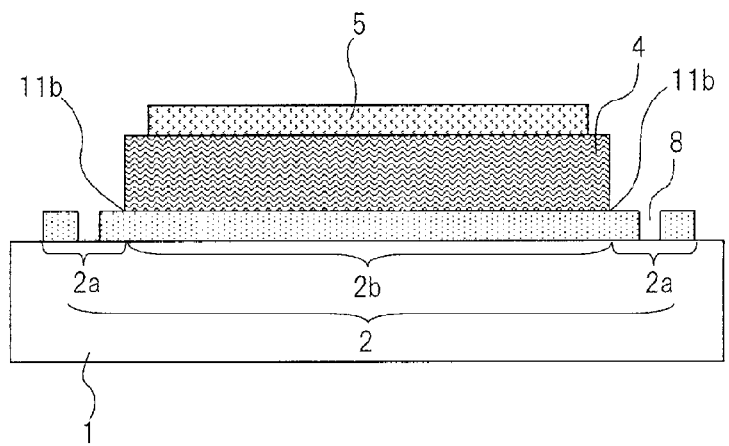
FIG. 2 A sectional view taken along cut line A-A shown in FIG. 1.
Figure 3:
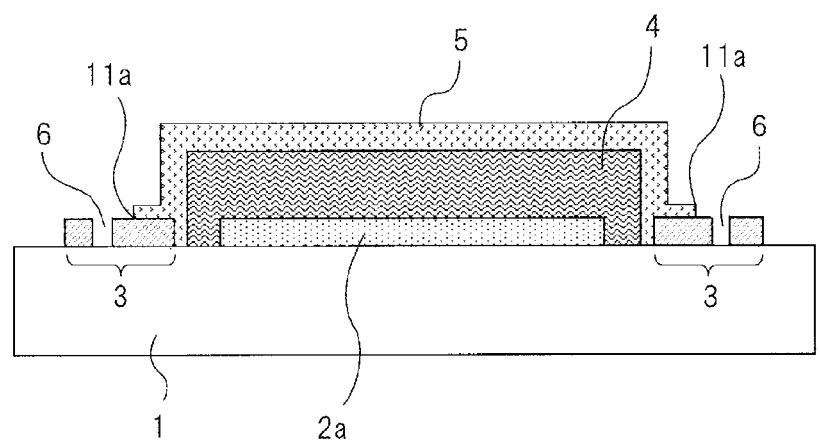
FIG. 3 A sectional view taken along cut line B-B shown in FIG. 1.
Figure 4:
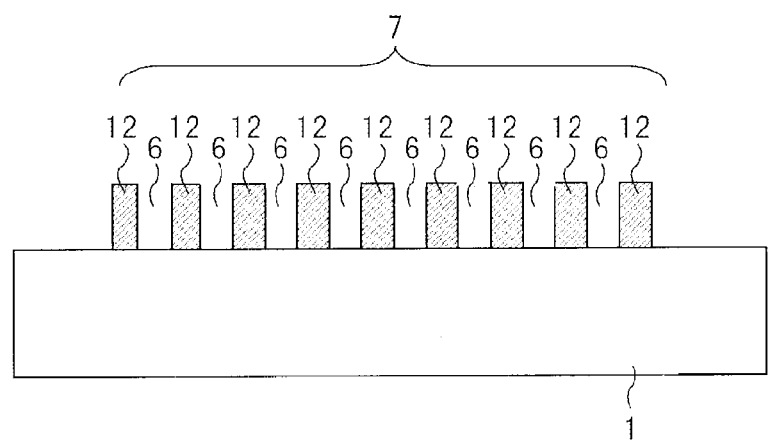
FIG. 4 A sectional view taken along cut line C-C shown in FIG. 1.
Figure 5:
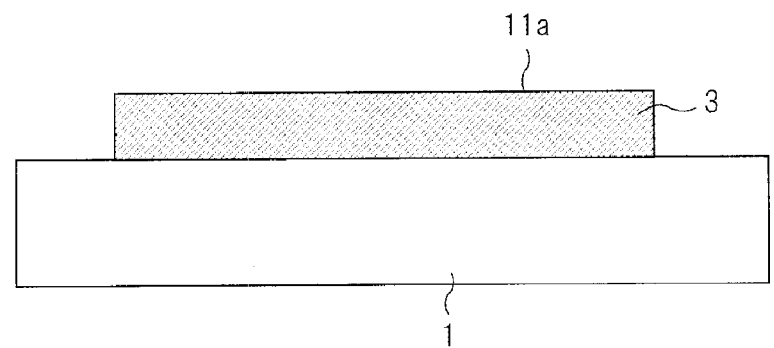
FIG. 5 A sectional view taken along cut line D-D shown in FIG. 1.

FIG. 1 is a plan view showing an organic electroluminescent lighting device according to an embodiment of the present invention. FIG. 2 is a sectional view taken along cut line A-A shown in FIG. 1. FIG. 3 is a sectional view taken along cut line B-B shown in FIG. 1. FIG. 4 is a sectional view taken along cut line C-C shown in FIG. 1. FIG. 5 is a sectional view taken along cut line D-D shown in FIG. 1. In FIG. 5, for easier understanding, organic light emitting layer 4 and negative electrode film 5 are not shown.

In organic electroluminescent lighting device 10 according to this embodiment, as shown in FIG. 3, positive electrode film 2 and negative electrode terminal film 3 are formed separate from each other on the surface of transparent substrate 1 (first film formation step). As shown in FIG. 2, positive electrode film 2 includes terminal 2a and electrode 2b, and organic light emitting film 4 is formed on the surface of electrode 2b (second film formation step). Then, as shown in FIG. 3, negative electrode film 5 is formed continuously from the surface of organic light emitting film 4 to the surface of negative electrode terminal film 3 (third film formation step).

Transparent substrate 1 is a glass substrate or a plastic substrate. Positive electrode film 2 is mainly made of an indium tin oxide (ITO). Terminals 2a are located at both ends of positive electrode film 2, and electrode 2b is formed to be continuous from terminal 2a. Terminal 2a can be disposed at one end of positive electrode film 2.

In this embodiment, negative electrode terminal film 3 includes resistive region 7 (first resistive region). Resistive region 7 includes a plurality of openings 6 (first openings) (refer to FIG. 1). The plurality of openings 6 is arranged vertically to the forward traveling direction of current I. Each of the plurality of openings 6 is surrounded with negative electrode terminal film 3, and the surface of transparent substrate 1 is exposed. Because of the inclusion of the plurality of openings 6, the cross-sectional area of conductor 12 (refer to FIG. 4) in resistive region 7 is smaller than that of negative electrode terminal film 3 (refer to FIG. 5) at boundary 11a with the outer peripheral part of negative electrode film 5. Negative electrode terminal film 3 accordingly serves as a resistive component.

Further, in this embodiment, terminal 2a of positive electrode film 2 includes resistive region 9 (second resistive region). As in the case of resistive region 7, resistive region 9 includes a plurality of openings 8 (second openings) (refer to FIG. 1). Because of the inclusion of the plurality of openings 8, the cross-sectional area of a conductor in resistive region 9 is smaller than that of terminal 2a at boundary 11b with electrode 2b. Terminal 2a accordingly serves as a resistive component.

As described above, according to this embodiment, the resistive component is added on the negative electrode side, and thus it is difficult for a large current to flow through negative electrode film 5. As a result, since it is difficult for negative electrode film 5 to be damaged even when inrush current flows, the occurrence of short-circuiting caused by the inrush current can be reduced.

According to this embodiment, the resistive component is added on the positive electrode side. In organic electroluminescent lighting device 10 according to this embodiment, the resistive components are accordingly formed on both of the positive electrode side and the positive electrode side. This limits the inrush current in both terminal 2a and negative electrode terminal film 3, and thus the occurrence of a short circuit caused by the inrush current is further reduced. Even when static electricity momentarily generates a high electric field, since voltage drops occur in both terminal 2a and negative electrode terminal film 3, a voltage applied between positive electrode terminal 2 and negative electrode film 5 is decreased. As a result, the occurrence of insulation breakdown caused by the static electricity is further reduced.

According to this embodiment, terminal 2a and electrode 2b are made of similar materials. This enables collective formation of openings 8 (by one mask) during the film formation step of positive electrode film 2. Accordingly, resistive region 9 can be easily formed without increasing the number of steps. Further, when positive electrode film 2 and negative electrode terminal film 3 are made of similar materials, these can be formed en bloc. As a result, resistive regions 7 and 9 can be easily formed without increasing the number of steps.

According to the present invention, negative electrode terminal film 3 and negative electrode film 5 can be made of different materials. In this case, by setting the resistance of the material of negative electrode terminal film 3 higher than that of the material of negative electrode film 5, even when no opening 6 is formed, negative electrode terminal film 3 can serve as the resistive component of the negative electrode side.

Further, according to the present invention, terminal 2a and electrode 2b can be made of different materials. In this case, by setting the resistance of the material of terminal 2a higher than that of the material of electrode 2b, even when no opening 6 is formed, terminal 2a can serve as the resistive component of the positive electrode side.

Figure 6:
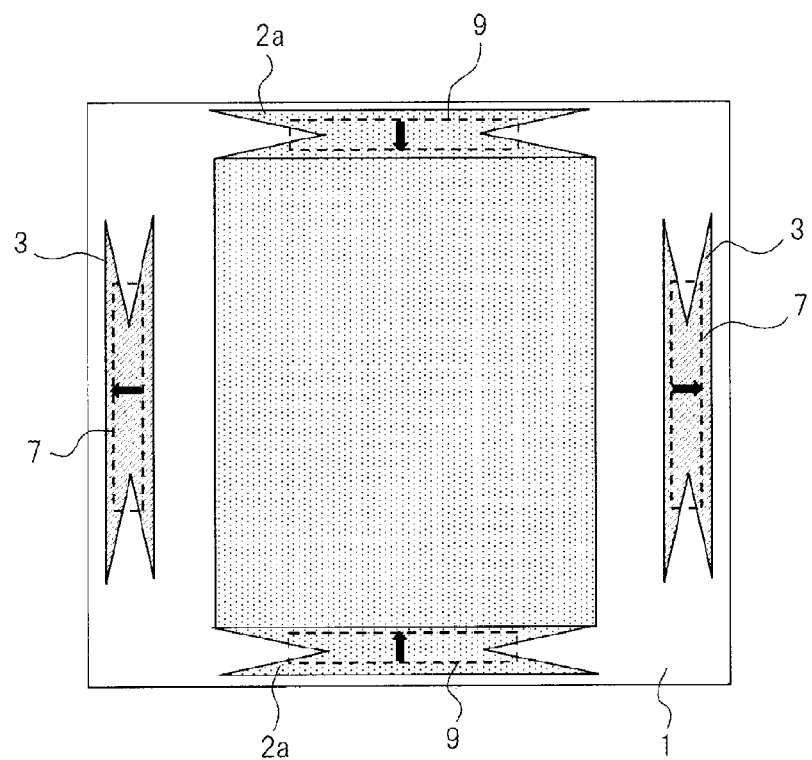
FIG. 6 A plan view showing an organic electroluminescent lighting device according to another embodiment of the present invention.
Figure 7:
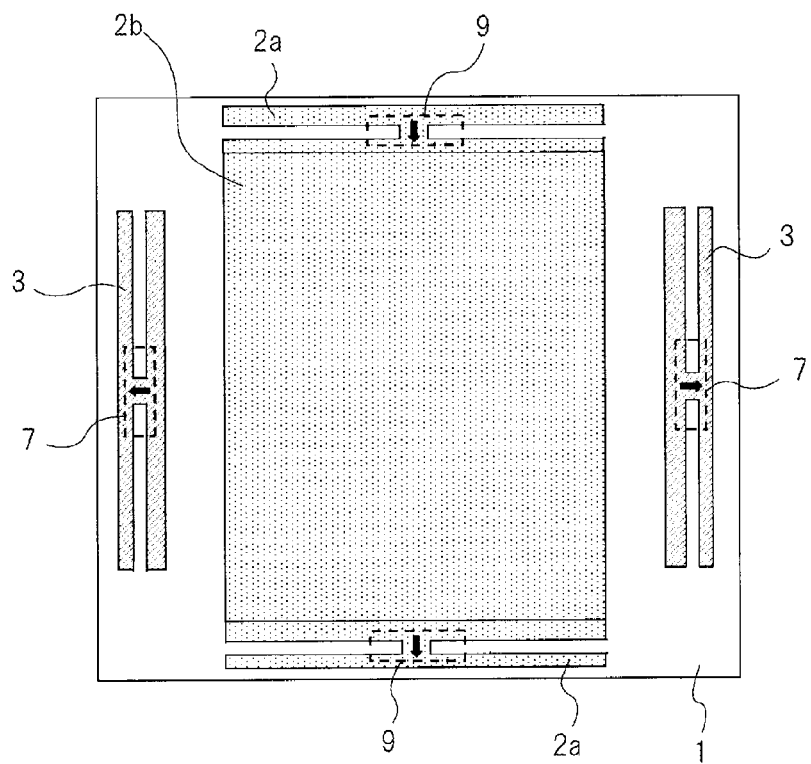
FIG. 7 A plan view showing an organic electroluminescent lighting device according to yet another embodiment of the present invention.
Figure 8:
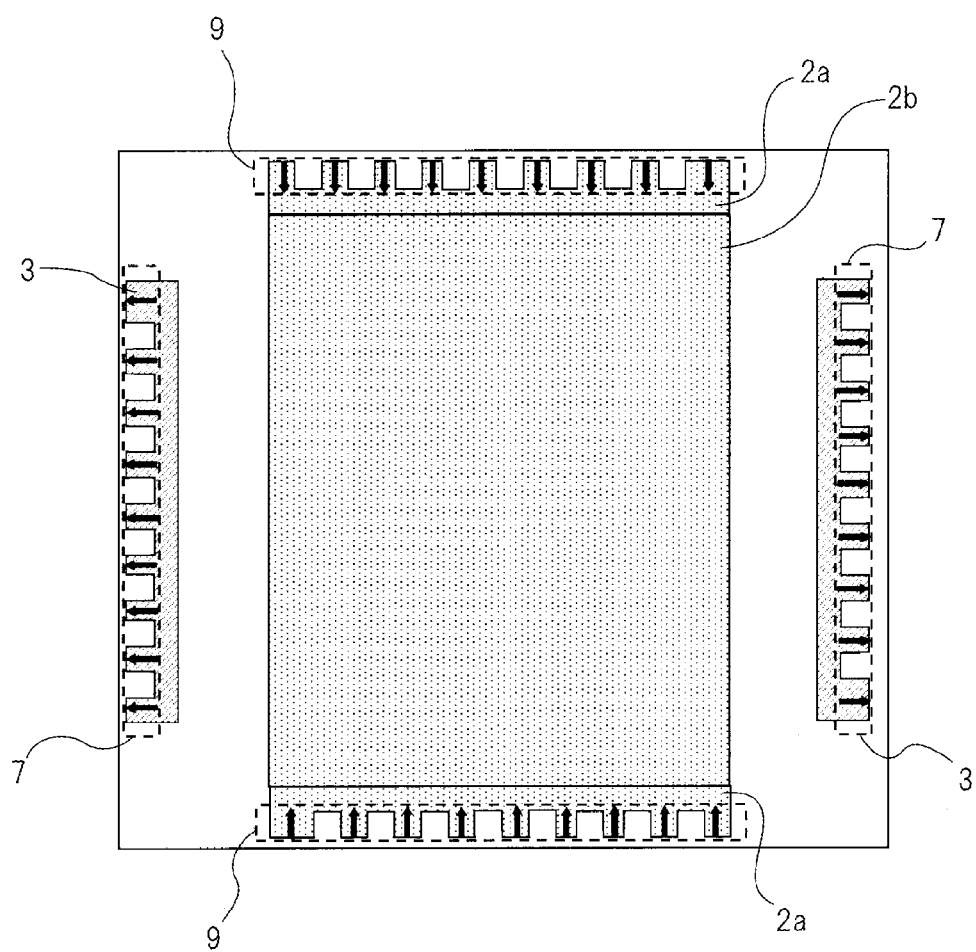
FIG. 8 A plan view showing an organic electroluminescent lighting device according to still yet another embodiment of the present invention.

FIGS. 6 to 8 are plan views showing organic electroluminescent lighting devices according to the other embodiments of the present invention. In FIGS. 6 to 8, for easier understanding, organic light emitting layer 4 and negative electrode film 5 are not shown.

In this embodiment, openings 6 and 8 are formed as means for forming resistive regions 7 and 9. However, according to the present invention, the means for forming resistive regions 7 and 9 is not limited to openings 6 and 8. For example, as shown in FIGS. 6 and 7, constricted parts can be formed in terminal 2a and negative electrode terminal film 3 to be used as resistive regions 7 and 9. Further, as shown in FIG. 8, the ends of terminal 2a and negative electrode terminal film 3 can be formed into comb shapes to be used as resistive regions 7 and 9.

As described above, even when terminal 2a and negative electrode terminal film 3 are processed, the cross-sectional area of each resistive region can be reduced. Thus, a short circuit and insulation breakdown by the inrush current can be prevented.

The embodiments of the present invention have been described. However, the present invention is not limited to the embodiments. Various changes understandable to those skilled in the art can be made of the configuration and the specifics of the present invention without departing from the spirit and the scope of the invention.

This application claims priority from Japanese Patent Application No. 2010-103166 filed Apr. 28, 20100, which is hereby incorporated by reference herein in its entirety.

REFERENCE NUMERALS

1 Transparent substrate
2 Positive electrode film
2a Terminal
2b Electrode
3 Negative electrode terminal film
4 Organic light emitting film
5 Negative electrode film
6, 8 Opening
7, 9 Resistive region
10 Organic electroluminescent lighting device
11a, 11b Boundary
12 Conductor

The invention claimed is:

1. An organic electroluminescent lighting device comprising:
a transparent substrate;
only one positive electrode film that is formed in a sheet shape on a surface of the transparent substrate and includes a terminal formed at one end or both ends and an electrode formed continuously from the terminal;
a negative electrode terminal film that is formed separate from the positive electrode film on the surface of the transparent substrate and includes a first resistive region;
an organic light emitting film formed on the surface of the electrode of the positive electrode film; and
only one negative electrode film that is formed in a sheet shape continuously from the surface of the organic light emitting film to the surface of the negative electrode terminal film,
wherein when viewed from a first cut surface of a thickness direction of the negative electrode film that is along boundary between the negative electrode terminal film and an outer peripheral part of the negative electrode film, a conductor's cross-sectional area in the first resistive region is smaller than a negative electrode terminal film's cross-sectional area at the boundary,
wherein the first resistive region is formed into a constricted shape, and
wherein the resistance of the material of the negative electrode terminal film is higher than that of the material of the negative electrode film, and the resistance of the material of the positive electrode terminal film is higher than that of the material of the positive electrode film.

2. The organic electroluminescent lighting device according to claim 1, wherein the terminal of the positive electrode film includes a second resistive region, and wherein when viewed from a second cut surface that is parallel to a boundary between the terminal and an outer peripheral part of the electrode and that is along a thickness direction of the terminal, a conductor's cross-sectional area in the second resistive region is smaller than a terminal's cross-sectional area at the boundary.

3. The organic electroluminescent lighting device according to claim 2, wherein the second resistive region includes a second opening surrounded with the terminal while a surface of the transparent substrate is exposed.

4. The organic electroluminescent lighting device according to claim 1, wherein the first resistive region includes a first opening surrounded with the negative electrode film while a surface of the transparent substrate is exposed.

5. The organic electroluminescent lighting device according to claim 1, wherein the first resistive region is a constricted part which is formed in the negative electrode terminal film.

6. An organic electroluminescent lighting device comprising:
a transparent substrate;
only one positive electrode film that is formed in a sheet shape on a surface of the transparent substrate and includes a terminal formed at one end or both ends and an electrode formed continuously from the terminal;
a negative electrode terminal film that is formed separate from the positive electrode film on the surface of the transparent substrate and includes a first resistive region;
an organic light emitting film formed on the surface of the electrode of the positive electrode film; and
only one negative electrode film continuously formed in a sheet shape continuously from the surface of the organic light emitting film to the surface of the negative electrode terminal film,
wherein when viewed from a first cut surface of a thickness direction of the negative electrode film that is along boundary between the negative electrode terminal film and an outer peripheral part of the negative electrode film, a conductor's cross-sectional area in the first resistive region is smaller than a negative electrode terminal film's cross-sectional area at the boundary, wherein the first resistive region is formed into comb shapes, and wherein the resistance of the material of the negative electrode terminal film is higher than that of the material of the negative electrode film, and the resistance of the material of the positive electrode terminal film is higher than that of the material of the positive electrode film.

7. A method for manufacturing an organic electroluminescent lighting device, comprising:

a first film formation step of forming only one positive electrode film in a sheet shape on a surface of a transparent substrate, which includes a terminal formed at one end or both ends and an electrode formed continuously from the terminal, and a negative electrode terminal film separate from the positive electrode film, which includes a first resistive region;

a second film formation step of forming an organic light emitting film on a surface of the electrode of the positive electrode film; and a third film formation step of forming only one negative electrode film in a sheet shape continuously from a surface of the organic light emitting film to a surface of the negative electrode terminal film, wherein in the first film formation step, when viewed from a first cut surface that is parallel to a boundary between the negative electrode terminal film and an outer peripheral part of the negative electrode film and that is along a thickness direction of the negative electrode terminal film, the negative electrode terminal film is formed so that a conductor's cross-sectional area in the first resistive region, which is formed into a constricted shape, is smaller than a negative electrode terminal film's cross-sectional area at the boundary, and wherein the resistance of the material of the negative electrode terminal film is higher than that of the material of the negative electrode film, and the resistance of the material of the positive electrode terminal film is higher than that of the material of the positive electrode film.

8. A method for manufacturing an organic electroluminescent lighting device, comprising:

a first film formation step of forming only one positive electrode film in a sheet shape on a surface of a transparent substrate, which includes a terminal formed at one end or both ends and an electrode formed continuously from the terminal, and a negative electrode terminal film separate from the positive electrode film, which includes a first resistive region;

a second film formation step of forming an organic light emitting film on a surface of the electrode of the positive electrode film; and a third film formation step of forming only one negative electrode film in a sheet shape continuously from a surface of the organic light emitting film to a surface of the negative electrode terminal film, wherein in the first film formation step, when viewed from a first cut surface that is parallel to a boundary between the negative electrode terminal film and an outer peripheral part of the negative electrode film and that is along a thickness direction of the negative electrode terminal film, the negative electrode terminal film is formed so that a conductor's cross-sectional area in the first resistive region, which is formed into comb shapes, is smaller than a negative electrode terminal film's cross-sectional area at the boundary, and wherein the resistance of the material of the negative electrode terminal film is higher than that of the material of the negative electrode film, and the resistance of the material of the positive electrode terminal film is higher than that of the material of the positive electrode film.

* * * * *